United States Patent
Luo et al.

(10) Patent No.: US 7,439,726 B2
(45) Date of Patent: *Oct. 21, 2008

(54) ELECTRICAL MEASURING INSTRUMENT HAVING DETACHABLE CURRENT CLAMP PROBE

(75) Inventors: Shounan Luo, Shanghai (CN); Wang Yong, Shanghai (CN)

(73) Assignee: Fluke Corporation, Everett, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/414,655

(22) Filed: Apr. 27, 2006

(65) Prior Publication Data

US 2007/0252579 A1    Nov. 1, 2007

(51) Int. Cl.
  *G01R 15/18*   (2006.01)
(52) U.S. Cl. ............ 324/127; 324/117 R; 324/149
(58) Field of Classification Search .......... None
  See application file for complete search history.

(56) References Cited

U.S. PATENT DOCUMENTS

| 3,555,420 | A | * | 1/1971 | Schwartz | 324/149 |
|---|---|---|---|---|---|
| 3,840,808 | A | | 10/1974 | Liebermann | 324/127 |
| 4,079,314 | A | * | 3/1978 | Jone | 324/149 |
| 4,259,635 | A | * | 3/1981 | Triplett | 324/149 |
| 4,378,525 | A | | 3/1983 | Burdick | 324/127 |
| 5,170,114 | A | * | 12/1992 | Lowenstein et al. | 324/128 |
| 5,612,616 | A | * | 3/1997 | Earle | 324/72.5 |
| 6,043,640 | A | | 3/2000 | Lauby et al. | 324/127 |
| 6,130,519 | A | * | 10/2000 | Whiting et al. | 320/105 |
| 6,137,285 | A | * | 10/2000 | Walsten et al. | 324/133 |
| 6,229,315 | B1 | * | 5/2001 | Briggs | 324/623 |
| 7,242,173 | B2 | * | 7/2007 | Cavoretto | 324/72.5 |
| 7,312,603 | B2 | * | 12/2007 | Luo et al. | 324/127 |
| 2007/0063689 | A1 | * | 3/2007 | Baker et al. | 324/76.11 |

FOREIGN PATENT DOCUMENTS

| JP | 56022964 | A | * | 3/1981 |
|---|---|---|---|---|
| JP | 06242171 | A | * | 9/1994 |

* cited by examiner

*Primary Examiner*—Paresh Patel
(74) *Attorney, Agent, or Firm*—Dorsey & Whitney LLP

(57) ABSTRACT

A current clamp meter having a current meter body and a detachable current clamp. The current meter body and the current clamp are configured so that the current clamp is detachable from the current meter body and the meter is operable with the current clamp either attached to the current meter body or detached from the current meter body.

7 Claims, 5 Drawing Sheets

ELECTRICAL MEASURING INSTRUMENT HAVING DETACHABLE CURRENT CLAMP PROBE

TECHNICAL FIELD

This invention generally relates to electronic test tools, and more specifically, to a current clamp meter having a detachable current clamp that can be used to measure current with the current clamp attached or detached from the meter.

BACKGROUND OF THE INVENTION

Electrical current can be measured by connecting a current meter in series with the wire. In many cases, however, disconnecting the wire to connect the current meter can be inconvenient. For example, the wire can be tightly grouped in a bundle with several other wires making it difficult to individually disconnect the wire of interest. Another example of the inconvenience is where a terminal to which the wire is connected is not conveniently located or is inaccessible, requiring the wire to be cut for the current meter to be connected in series. It is time consuming to reconnect the two ends of the cut wire after a measurement is taken, and can be dangerous in situations where relatively high current is carried by the wire. Additionally, the integrity of the wire is compromised by cutting and reconnecting, thus, potentially raising reliability problems.

A clamp probe connected to a conventional multimeter can be used to measure electrical current without the need for disconnecting a wire. The clamp probe is opened, the wire is inserted into the clamp, and the clamp is closed to take a current measurement. The closed clamp includes a core of ferromagnetic material, which when closed, represents the core of a transformer. The wire passing through the clamp represents the primary winding. As known, a current flowing in the wire induces a magnetic flux in the core of the transformer, which in turn, induces a current in a secondary winding of the transformer. Using this physical phenomena, the magnitude and polarity of the current in the clamped wire can be determined based on the current induced in the secondary winding and the characteristics of the transformer formed by the clamped wire.

As previously discussed, a clamp probe can be connected to a multimeter having current measuring capabilities for taking current measurements. The clamp probe is typically connected to the multimeter through wires that connect to plug-in terminals. A benefit to this arrangement is that the clamp probe can be clamped to the wire and the meter positioned so that a technician can conveniently view the measured value, which is especially useful when the wire is located in a difficult to reach location. However, two hands are typically necessary to take a measurement: one to put the clamp in place and another to hold the meter while taking a measurement. Additionally, since the clamp probe is an attachment to the multimeter, it is typically stored separately from the meter, which can be inconvenient when carrying the equipment around and can also be easily misplaced when not used.

As an alternative to a separate probe and meter arrangement, clamp meters are designed with the clamp integrated into the body of the meter, which can provide the convenience of taking a measurement using one hand. That is, only one hand is used to open and close the clamp for clamping a wire and to take a current reading. Additionally, with the clamp integrated into the body of the meter, there is no possibility of misplacing the clamp or having any difficulties transporting the equipment.

"One-handed" clamp meters are generally acceptable for applications where the display can be easily viewed by the technician with the meter clamped to the wire for measurement. However, problems with reading the measurement can arise where the wire is difficult to reach or is positioned such that the display of the meter is obscured when the meter is in position for measurement. In order to take a measurement in these situations, a technician can quickly check the display by forcing himself into an awkward position just long enough to view the display, or where the meter has a feature which captures a measured value on a display, the technician can remove the meter from the awkward or obscured position after the measurement is taken and view the captured measured value. These solutions have obvious disadvantages. In one case, the technician must put himself in a physically uncomfortable and potentially dangerous position when attempting to view the measured value on the display of an awkwardly positioned meter. In the other case, removing the meter from a wire that was difficult to clamp in the first place is inconvenient and can be time consuming if the clamp meter must be re-clamped to take additional measurements from the same wire. Additionally, where real time measurements are desired, such as measuring start-up currents or detecting intermittent current loading, the meter must be kept in place during continuous measurement.

A meter having a remote clamp probe, such as using a clamp probe coupled to a multimeter as previously described, can be used to address the problems with awkward to reach or difficult positioned wires by clamping the wire with the remote clamp, and having the meter positioned in a convenient location for reading the measured values. However, in addition to the disadvantages previously discussed, these meters also lack the convenience of one-handed measurements for applications where it is possible to do so. A solution to the problem is for a technician to have both types of meters in order to have the benefits of each design. This is a costly solution since two different meters need to be purchased, although only one meter is typically used at a time for taking a measurement.

SUMMARY OF THE INVENTION

One aspect of the invention provides a current clamp meter having a current meter body and a current clamp. The current meter body includes circuits operable to calculate a current measurement from an input signal and the current clamp is electrically coupled to the circuits included in the current meter body to sense a current and provide the input signal. The current meter body and the current clamp are configured to have the current clamp detachable from the current meter body so that the current clamp meter can be operated with the current clamp either attached to the current meter body or detached from the current meter body.

Another aspect of the invention provides a handheld electrical measuring instrument that includes a current probe and an instrument housing. The housing has a probe retention member configured to receive and detachably retain the current probe and further configured to allow the current probe to be detached from the probe retention member and used either retained by or detached from the probe retention member.

Another aspect of the invention provides a method for operating a current clamp meter. The method includes detaching a current clamp probe releasably attached to a housing of the current clamp meter and attaching the current clamp probe to a first conductor. A first current in the first conductor is measured. The method further includes reattaching the current clamp to the housing of the current clamp meter, attaching the current clamp while attached to the housing to a second conductor, and measuring a second current in the second conductor.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
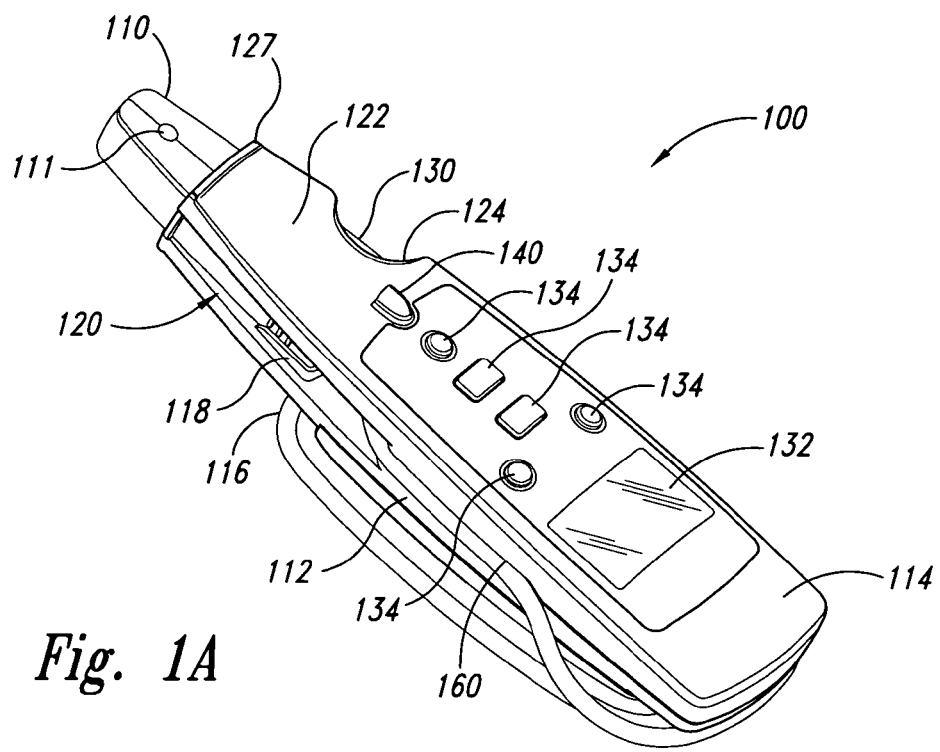
FIGS. 1A and 1B are isometric drawings of a clamp meter according to an embodiment of the present invention having a current clamp nested in the body of the meter.
Figure 1B:
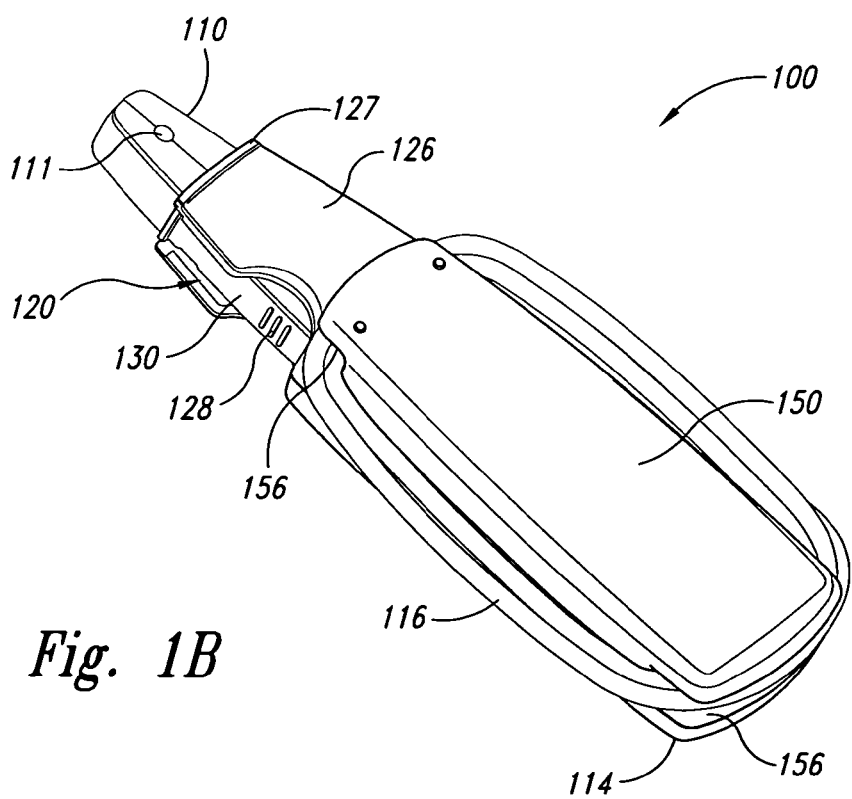

FIGS. 1A and 1B illustrate a clamp meter 100 according to an embodiment of the present invention. As will be described in more detail below, the clamp meter 100 includes a current clamp probe 110 that is detachable from a housing 112 in which circuitry for the clamp meter 100 are encased. The clamp probe 110 includes a current sensor for detecting current in a wire positioned in an opening 111. Examples of current sensors include Hall-effect devices and coils such as a current transformer, as known in the art. As shown in FIGS. 1A and 1B, the clamp probe 110 is positioned in a recess 120 generally defined by clamp retention members 122, 126 that extend from a body 114. The clamp retention members 122, 126 have respective cutouts 124, 128 to expose a lever portion 130 of the clamp probe 110. When depressed, the lever portion 130 causes jaws of the clamp probe 110 to open to receive a wire in the opening 111 for measurement. The clamp probe 110 is a spring loaded device whereupon release of the lever portion 130, the clamp probe 110 will close. Consequently, when the wire is positioned in the opening 111, the lever portion 130 can be released to capture the wire for measurement. A wire can be released from the opening 111 by depressing the lever portion 130 and withdrawing the meter 100.

An interior surface of each of the clamp retention members 122, 126 can optionally include a guide 118 for facilitating placement of the clamp probe 110 in the recess 120. In one embodiment, the clamp probe 110 abuts the guide 118 when correctly positioned in the recess 120. The guide 118 can be further configured to keep the clamp probe 110 from moving when pressure is applied to the lever portion 130. The clamp retention members 122, 126 can include optional ridges 127 to provide tactile indicators of a known distance from the opening 111 when the clamp probe 110 is positioned in the recess 120. The clamp probe 110 can be retained by the clamp retention members 122, 126 using known techniques, such as an interference fit, snap fit, or the like, between the clamp probe 110 and the clamp retention members 122, 126. Preferably, the technique used is sufficient to hold the clamp probe 110 in place when pressure is applied to the lever portion 130 while still allowing removal from the clamp retention members 122, 126.

On a front-side of the meter 100 is a user interface for receiving input from and providing information to a user. The user interface shown in FIG. 1A includes a display 132 for displaying information, such as a measured value, mode of operation, and device and battery status. The user interface further includes buttons 134 that can be used to receive input from the user and carry out functions in the meter, for example, turning the meter on and off, selecting a mode of operation, selecting a measurement range, and taking a measurement. Although the present embodiment includes buttons 134, additional or alternative user input devices can be used in other embodiments, such as dials, thumb wheels, and switches. Additionally, the user input devices can be located at different positions than shown in FIG. 1A. An optional light 140 can be included on the body 114 and positioned to provide illumination in the direction of the clamp probe 110 to aid in locating and clamping a wire in a darkened environment. The light 140 can use a conventional light source, such as a filament-based light source and a light emitting diode ("LED") light source. Other types of light sources can be used as well. The light 140 can be designed to be switched on and off using one of the buttons 134.

Figure 3:
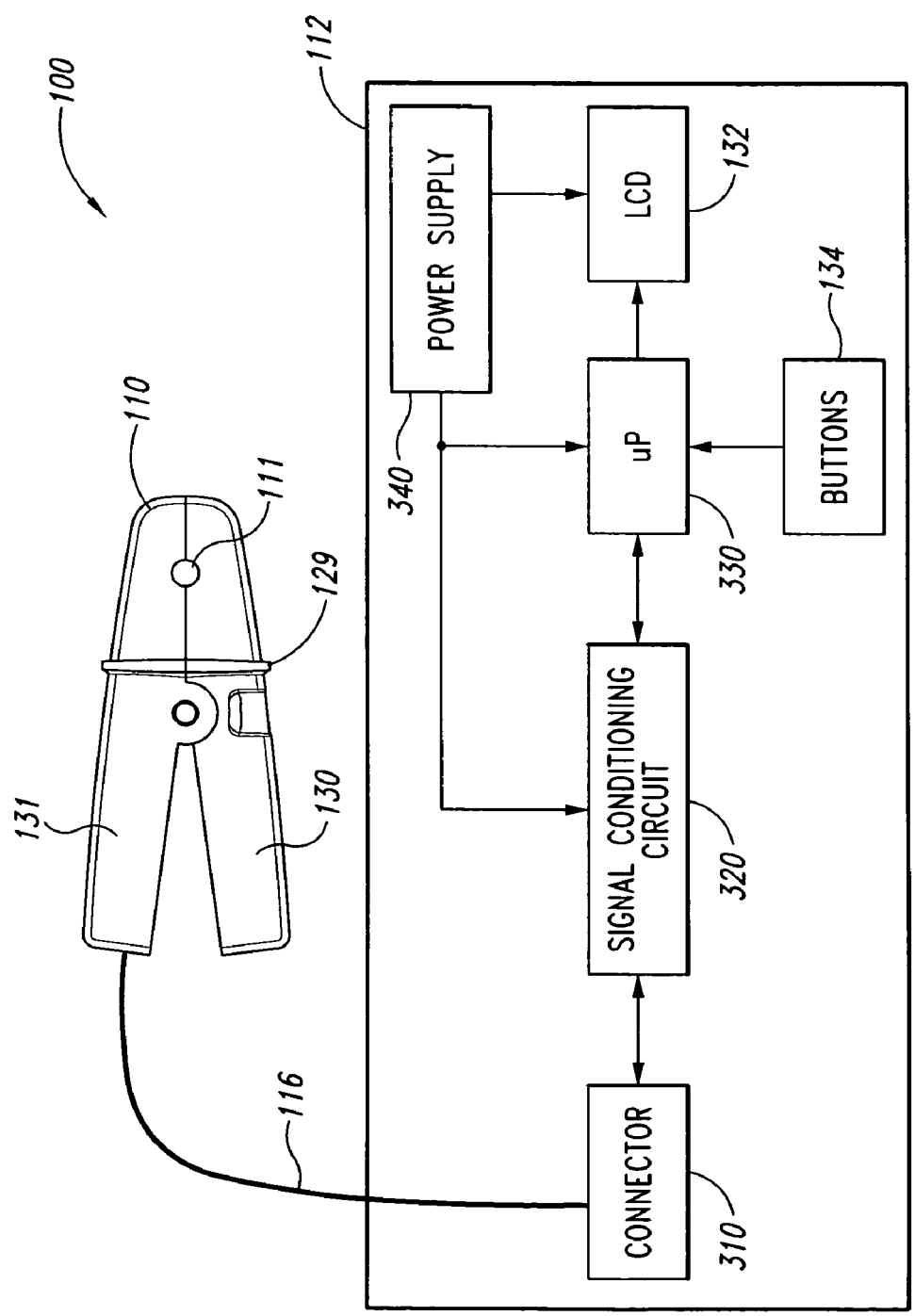
FIG. 3 is a simplified block diagram of the clamp meter according to an embodiment of the present invention.

The clamp probe 110 is electrically coupled to circuitry enclosed by the housing 112 by wire 116. FIG. 3 illustrates a simplified block diagram of electrical circuits that can be included in the clamp meter 100. The electrical circuits shown in FIG. 3 are provided by way of example. The circuits included in the clamp meter 100 can be implemented in the meter 100 using conventional designs and operation.

The clamp probe 110 is electrically coupled to a connector 310 through the wire 116. Electrical signals generated by the current sensor in the clamp probe 110 in response to detecting current in a wire positioned in the opening 111 are provided through the connector 310 to a signal conditioning circuit 320. The signal conditioning circuit 320 conditions the electrical signals, for example, by buffering, filtering, and amplifying the signal. A processor 330 receives the conditioned signal and computes a current measurement. The processor 330 generates signals to drive a liquid crystal display ("LCD") 132 to display information, including the computed current value. Although not shown in FIG. 3, an analog-to-digital converter ("ADC") is used to quantize the conditioned signal into digital information representing the conditioned signal prior to processing by the processor 330. Buttons 134 are provided for user input to the processor 330. A power supply 340 provides power to various circuitry of the meter 100, such as the signal conditioning circuit 320, the processor 330, and the LCD 132. The power supply 340 typically includes a battery and power circuits for regulating the provision of power to the circuits in the meter 100.

In other embodiments of the present invention, the processor 330 is operable to compute measurements for other electrical characteristics, as detected by test probes coupled to electrical terminals (not shown) further included in the connector 310. For example, multimeter functionality can be integrated into the meter 100, such as measuring voltage and resistance.

With reference to FIGS. 1A and 1B, the wire 116 can be neatly stowed to prevent tangling by wrapping the wire 116 around a rear portion 150. The rear portion is configured to form recesses 156 into which the wire 116 is received when wrapped. An optional groove 160 can be included in the body 114 for holding the wire 116 in place when wrapped around the rear portion 150 and the clamp probe 110 is positioned in the clamp retention members 122, 126. In an embodiment of the present invention, the rear portion 150 is removable to provide access to the electronics of the meter 100, such as for removal and installation of a battery or to allow for calibration. In alternative embodiments, the rear portion 150 is integral with the rest of the housing 112.

Figure 2A:
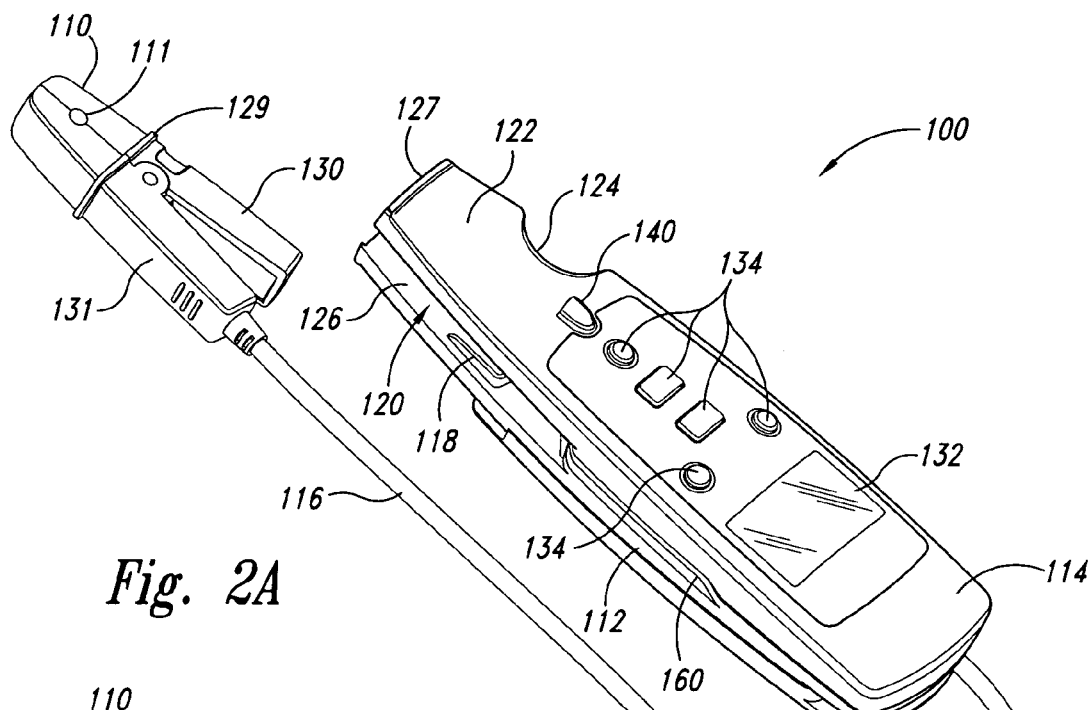
FIGS. 2A and 2B are isometric drawings of the clamp meter of FIGS. 1A and 1B with the current clamp detached.
Figure 2B:
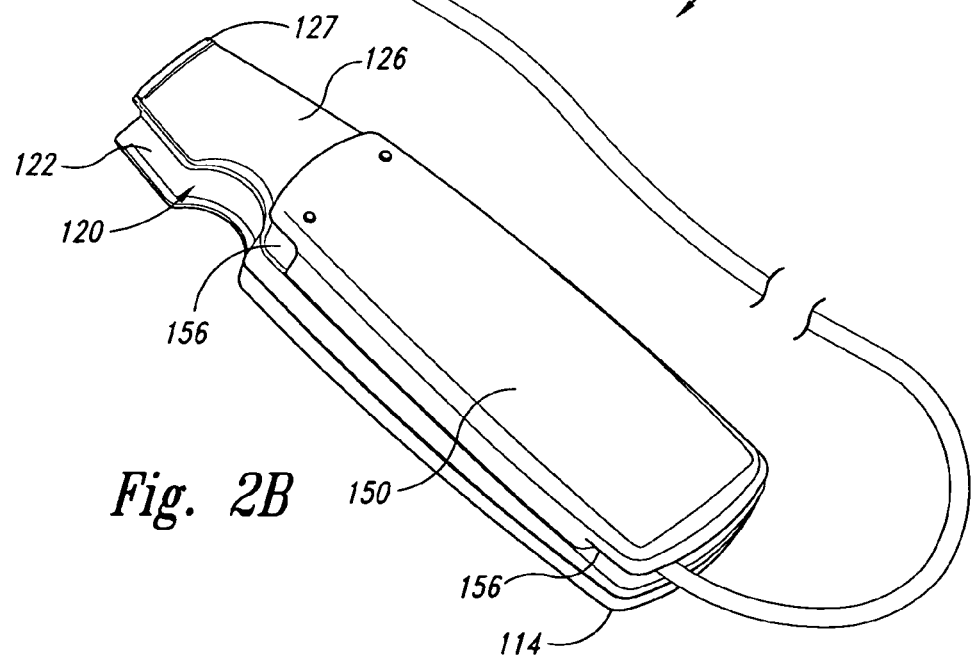

FIGS. 2A and 2B illustrate the meter 100 with the clamp probe 110 detached from the housing 112 and the wire 116 fully deployed. The clamp probe 110 includes a ridge 129 to provide a tactile indicator of a known distance from the opening 111 when the clamp probe 110 is detached from the housing 112. The jaws of the clamp probe 110 can be opened by applying opposing pressure to the lever portion 130 and an opposite lever portion 131. As previously discussed, the clamp probe 110 is spring loaded, and upon release of the lever portion 130 and the opposite lever portion 131, the jaws of the clamp probe 110 will close.

Figure 4A:
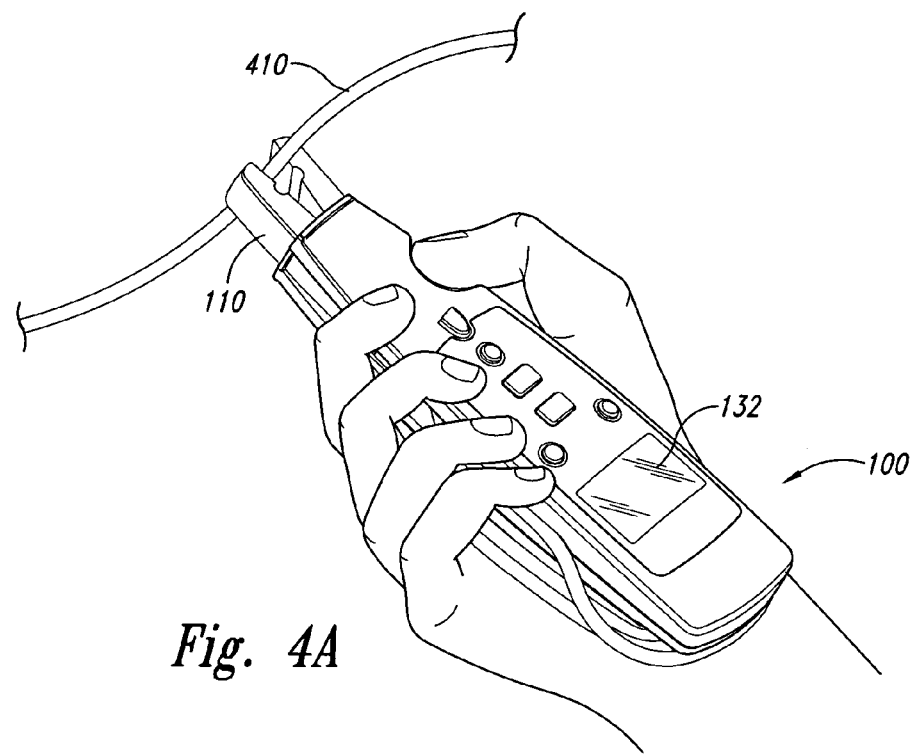
FIGS. 4A and 4B illustrate the use of a clamp meter according to an embodiment of the present invention with the current clamp attached.
Figure 4B:
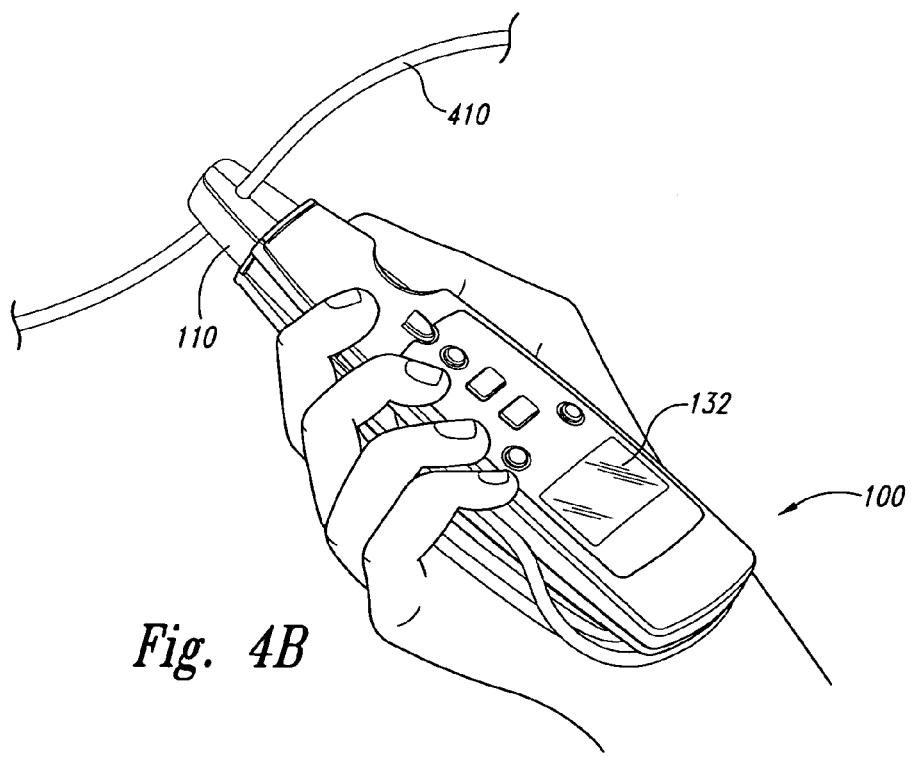
Figure 5:
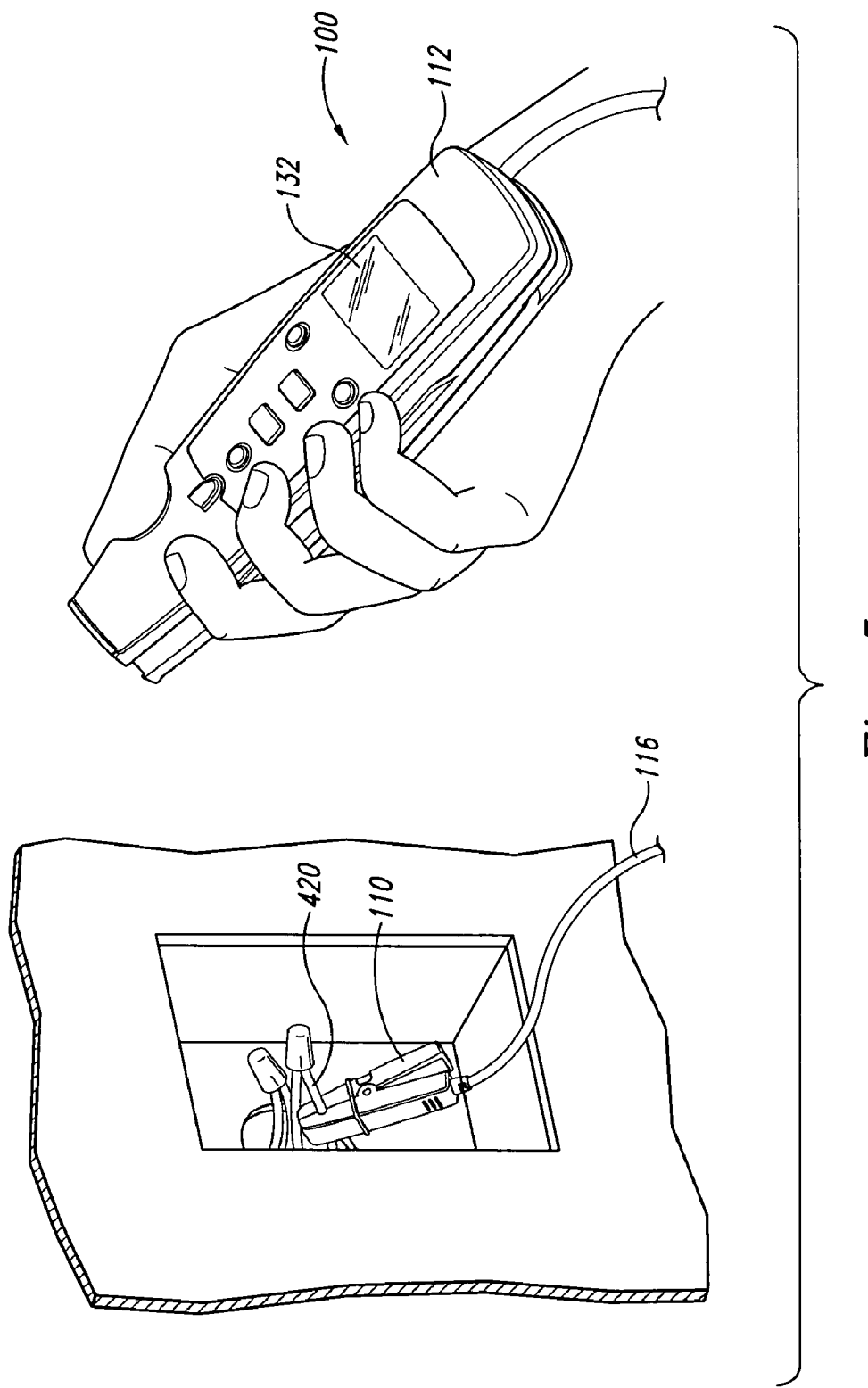
FIG. 5 illustrates the use of a clamp meter according to an embodiment of the present invention with the current clamp detached.

As shown in FIGS. 4A, 4B and 5, the meter 100 can be used with the clamp probe 110 positioned in the recess 120 or with the clamp probe 110 detached. Consequently, the convenience and functionality of the two conventionally configured clamp probe/meters are combined in one clamp meter.

FIGS. 4A and 4B illustrate operation with the clamp probe 110 in place between the clamp retention members 122, 126. With the clamp probe 110 in place, clamping a wire 410 and taking a measurement can be accomplished with one-handed operation. As shown in FIG. 4A, the clamp probe 110 can be operated by pressing the lever portion 130 using the thumb or a finger of one hand in order to clamp the wire 410. When the lever portion 130 is released, as shown in FIG. 4B, the clamp probe 110 captures the wire 410. If necessary, buttons 134 can be pressed using the thumb or fingers of the same hand during measurement. One-handed operation is convenient for situations where the display 132 is viewable when the wire is clamped and the wire is easily accessible.

As shown in FIG. 5 illustrates operation of the meter 100 with the clamp probe 110 detached. With the clamp probe 110 detached from the housing 112 and the wire 116 unwrapped from the rear portion 150, the clamp probe 110 can be clamped to a wire 420 in an awkward location and the housing 112 positioned so that the display 132 is easily viewable. In this manner, it is unnecessary to remove the meter 100 from the clamped wire 420 after an initial measurement is taken, saving time and effort where subsequent measurements from the same wire are to be taken.

In the embodiment of the clamp meter 100, the clamp probe 110 is illustrated as being slightly tapered to a "nose," which facilitates clamping of a wire that may be bundled with other wires. However, other shaped clamp probes can be used in alternative embodiments. For example, a clamp probe having more arcuate shaped jaws or having a larger opening can be used to accommodate larger diameter wires or used for applications where individual wires are sufficiently spaced and can be easily clamped. Even with differently shaped clamp probes, the option of taking a measurement with the clamp probe attached for one-handed operation or taking a measurement with the clamp probe detached is still desirable since the dual-use configuration allows the display to be conveniently positioned during measurement.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A handheld electrical measuring instrument, comprising:
    a current clamp probe;
    an instrument housing having a probe retention member configured to receive and detachably retain the current clamp probe and further configured to allow the current clamp probe to be detached from the probe retention member and used either retained by or detached from the probe retention member; and
    measuring circuitry located in the housing and coupled to the current clamp probe.

2. The instrument of claim 1 wherein the probe retention member comprises first and second members extending from the body, the current clamp probe retained between the first and second members.

3. The instrument of claim 2 wherein each of the first and second members has an interior surface on which a guide is formed, the current clamp probe abutting the guide when retained by the first and second members.

4. The instrument of claim 1, further comprising a wire configured to electrically couple the current clamp probe to the measuring circuitry, the housing further having a portion around which the wire can be wrapped when retained by the probe retention member.

5. The instrument of claim 4 wherein the portion around which the wire can be wrapped comprises a rear portion of the housing that is configured to provide at least one recess in which the wire is received when wrapped.

6. The instrument of claim 1 wherein the probe retention member includes a portion that engages the retained current clamp probe.

7. The instrument of claim 1 wherein the current clamp has a tapered profile.

* * * * *